United States Patent
Johnson et al.

(10) Patent No.: US 10,951,007 B2
(45) Date of Patent: Mar. 16, 2021

(54) OPTICALLY PUMPED TUNABLE VCSEL EMPLOYING GEOMETRIC ISOLATION

(71) Applicant: Axsun Technologies, Inc., Billerica, MA (US)

(72) Inventors: Bartley C. Johnson, North Andover, MA (US); Walid A. Atia, Jamaica Plain, MA (US); Peter S. Whitney, Lexington, MA (US); Mark E. Kuznetsov, Lexington, MA (US); Edward J. Mallon, Marshfield, MA (US)

(73) Assignee: EXCELITAS TECHNOLOGIES CORP., Waltham, MA (US)

( * ) Notice: Subject to any disclaimer, the term of this patent is extended or adjusted under 35 U.S.C. 154(b) by 0 days.

(21) Appl. No.: 16/409,272

(22) Filed: May 10, 2019

(65) Prior Publication Data

US 2019/0348813 A1 Nov. 14, 2019

Related U.S. Application Data

(60) Provisional application No. 62/670,423, filed on May 11, 2018.

(51) Int. Cl.
*H01S 5/183* (2006.01)
*H01S 5/04* (2006.01)
(Continued)

(52) U.S. Cl.
CPC .......... *H01S 5/041* (2013.01); *H01S 5/18361* (2013.01); *H01S 5/18366* (2013.01);
(Continued)

(58) Field of Classification Search
CPC .... H01S 5/041; H01S 5/18366; H01S 5/1039; H01S 5/4031
See application file for complete search history.

(56) References Cited

U.S. PATENT DOCUMENTS

| | | | |
|---|---|---|---|
| 6,574,255 B1 * | 6/2003 | Caprara | H01S 5/141 372/36 |
| 6,611,546 B1 | 8/2003 | Garnache et al. | |

(Continued)

FOREIGN PATENT DOCUMENTS

EP 2369696 9/2011

OTHER PUBLICATIONS

Anonymous, "Fiber Optic Test and Measurement," section entitled "Special Case for ASE Sources" Dennis Derickson, Editor, Prentice Hall, 601-604 (1998).

(Continued)

*Primary Examiner* — Michael Carter
(74) *Attorney, Agent, or Firm* — HoustonHogle LLP

(57) ABSTRACT

An optically pumped tunable VCSEL swept source module has a VCSEL and a pump, which produces light to pump the VSCEL, wherein the pump is geometrically isolated from the VCSEL. In different embodiments, the pump is geometrically isolated by defocusing light from the pump in front of the VCSEL, behind the VCSEL, and/or by coupling the light from the pump at an angle with respect to the VCSEL. In the last case, angle is usually less than 88 degrees. There are further strategies for attacking pump noise problems. Pump feedback can be reduced through (1) Faraday isolation and (2) geometric isolation. Single frequency pump lasers (Distributed feedback lasers (DFB), distributed Bragg reflector lasers (DBR), Fabry-Perot (FP) lasers, discrete mode lasers, volume Bragg grating (VBG) stabilized lasers can eliminate wavelength jitter and amplitude noise that accompanies mode hopping.

19 Claims, 7 Drawing Sheets

(51) Int. Cl.
 H01S 5/50 (2006.01)
 H01S 5/022 (2021.01)
 H01S 5/22 (2006.01)
 H01S 5/30 (2006.01)
 H01S 5/343 (2006.01)
(52) U.S. Cl.
 CPC ........ *H01S 5/5045* (2013.01); *H01S 5/02276* (2013.01); *H01S 5/02284* (2013.01); *H01S 5/22* (2013.01); *H01S 5/3013* (2013.01); *H01S 5/343* (2013.01)

(56) References Cited

U.S. PATENT DOCUMENTS

| | | | |
|---|---|---|---|
| 6,645,784 | B2 | 11/2003 | Tayebati et al. |
| 10,236,661 | B2* | 3/2019 | Sugiyama ........... H01S 5/18366 |
| 10,714,893 | B2* | 7/2020 | Jayaraman .......... H01S 5/18361 |
| 2003/0026312 | A1* | 2/2003 | Clayton ................. H01S 5/041 372/50.1 |
| 2008/0019406 | A1* | 1/2008 | Abram ................... H01S 5/183 372/36 |
| 2008/0031289 | A1* | 2/2008 | Cho ........................ H01S 5/041 372/22 |
| 2014/0176958 | A1 | 6/2014 | Flanders et al. |
| 2015/0288129 | A1* | 10/2015 | Jain ................... H01S 3/094084 372/6 |
| 2016/0028208 | A1 | 1/2016 | Cable et al. |
| 2016/0241000 | A1 | 8/2016 | Gronenborn |

OTHER PUBLICATIONS

Anonymous, "MEMS-VCSEL Swept-Source Lasers, 1300 NM," Thorlabs, https://www.thorlabs.com/newgrouppage9.cfm?objectgroup_id=12057, 1-8 (2017-2018).
Bandwidth10, Inc. tunable VCSELs. http://www.bandwidth10.com/ (2019).
Coldren, L.A., et al., "Diode Lasers and Photonic Integrated Circuits," Chapter 5, John Wiley & Sons, Inc. (1995).
Eblana Photonics. http://www.eblanaphotonics.com/news-and-events.php (2019).
Grulkowski, I., et al., "Retinal, anterior segment and full eye imaging using ultrahigh speed swept source OCT with vertical-cavity surface emitting lasers," Biomed. Opt. Express 3(11): 2733-2751 (2012).
Jayaraman, V., et al., "High-sweep-rate 1310 nm MEMS-VCSEL with 150 nm continuous tuning range," Electronics Letters, 48(14), 867-869 (2012).
Jayaraman, V., et al., "Rapidly swept, ultra-widely-tunable 1060 nm MEMS-VCSELs", Electronics Letters, 48, 1331-1333 (2012).
Jayaraman, V., et al., "Recent Advances in MEMS-VCSELs for High Performance Structural and Functional SS-OCT Imaging", Proc. of SPIE 8934, 893402-1-893402-11 (2014).
Jayaraman,V., et al., "VCSEL Swept Light Sources," Optical Coherence Tomography, 659-686 (2015).
John, D.D., et al., "Single-Mode and High-Speed 850nm MEMS-VCSEL," in Lasers Congress 2016, OSA Technical Digest (Optical Society of America, 2016), paper ATh5A.2 (2016).
John, D.D., et al., "Wideband electrically-pumped 1050 nm MEMS-tunable VCSEL for ophthalmic imaging," J. Lightwave Technol. 33, 3461-3468 (2015).
Johnson, B., et al., "Coherence properties of short cavity swept lasers," Biomed. Opt. Express 8(2): 1045-1055 (2017).
Laser Components, Inc. https://www.lasercomponents.com/fileadmin/user_upload/home/Datasheets/pd_ld/luxxmaster_785nm_butterfly.pdf (2011).
Lumics GmbH. 808 nm pump laser with FBG option: http://www.lumics.de/wp-content/uploads/LU0808M250.pdf (2019).
Matsui, Y., et al., "Complete Polarization Mode Control of Long-Wavelength Tunable Vertical-Cavity Surface-Emitting Lasers Over 65-nm Tuning, Up to 14-mW Output Power," IEEE J. Quantum Electronics, 39(9): 1037-1048 (2003).
O'Carroll, J., et al., "Wide temperature range 0 < T < 85 °C narrow linewidth discrete mode laser diodes for coherent communications applications," (2011).
O'Carroll, J., et al., "Wide temperature range 0 < T < 85 °C narrow linewidth discrete mode laser diodes for coherent communications applications," Optics Express, 19 (26): B90-B95 (2011).
Ondax, Inc. http://www.ondax.com/downloads/surelock/Laser-Selector-Guide-2.pdf (2017).
Partial International Search Report of the International Searching Authority, dated Aug. 14, 2019, from International Application No. PCT/US2019/031795, filed on May 10, 2019. Eleven pages.
Phelan, P., et al., "Discrete Mode Laser Diodes Emitting at λ~689 and 780nm for Optical Atomic Clock Applications," Eblana Phototonics, 1-24 (2015).
Phelan, R., "Low Linewidth Discrete Mode Lasers for Coherent Communications Applications,"Eblana Photonics, 1-34 (2014).
Phelan, R., et al., "In 0.75GA0.25AS/InP Multiple Quantum Well Discrete Mode Laser Diode Emitting at 2μm," Eblana Photonics, 1-6 (2012).
Potsaid, B., et al., "MEMS tunable VCSEL light source for ultrahigh speed 60kHz-1MHz axial scan rate and long range centimeter class OCT imaging," Proc. of SPIE, 8213, 82130M1-82130M-8, (2012).
Rao, Y., et al. "Long-Wavelength VCSEL Using High-Contrast Grating", IEEE J. Selected Topics in Quantum Electronics, 19(4): 1701311-1701311 (2013).
Wang, Z. et al., "Cubic meter volume optical coherence tomography", Optica, 3(12): 1496-1503 (2016).
Wenzel, H., et al., "High-power 808 nm ridge-waveguide diode lasers with very small divergence, wavelength-stabilized by an external volume Bragg grating", Optics Letters, 34(11): 1627-1629 (2009).
Zou, Q., et al., "Analysis of Coherence-Collapse Regime of Semiconductor Lasers Under External Optical Feedback by Perturbation Method", Chapter 5 in Semiconductor Laser Diode Technology and Applications, Edited by Dnyaneshwar Patil, (2012). open access https://www.intechopen.com/books/semiconductor-laser-diode-technology-and-applications.
International Search Report and Written Opinion of the International Searching Authority, dated Oct. 11, 2019, from International Application No. PCT/US2019/031795, filed on May 10, 2019. Sixteen pages.

* cited by examiner

OPTICALLY PUMPED TUNABLE VCSEL EMPLOYING GEOMETRIC ISOLATION

RELATED APPLICATIONS

This application claims the benefit under 35 USC 119(e) of U.S. Provisional Application No. 62/670,423, filed on May 11, 2018, which is incorporated herein by reference in its entirety.

BACKGROUND OF THE INVENTION

MEMS (Micro electro-mechanical systems) tunable VCSELs (Vertical cavity surface emitting lasers) are useful in optical coherence tomography (OCT) because of their tuning speed, large coherence length [1,2,3], and lack of coherence revival artifacts [4]. While VCSELs at many wavelength bands are possible, most work to date has occurred in the 1550 nanometer (nm) [5,6,7], 850 nm [8], 1310 nm [9,10,11,12], and 1060 nm [9,10,13,14] wavelength bands. The 1550 band is useful in optical telecommunications, as well as the 850 and 1310 nm lasers. The 1310 and 1060 bands are popular for use in OCT. The 1060 band, in particular, is of interest because of applications in ophthalmology, including imaging of the retina [14] and in biometry (distance measurement of structures in the whole eye) [14]. The 850 nm band is also interesting for ophthalmology because of the transparency of water in that range and compatibility with silicon photodetectors.

Optically pumped MEMS tunable VCSELs generally have a wider tuning range than electrically pumped ones [2,9,13]. In optical pumping, pump laser light is used to power the VCSEL. Pump light absorbed in the VCSEL is then reemitted at a longer wavelength as tunable VCSEL light.

Optical pumping, however, presents the challenge of exciting the VCSEL with a low noise pump laser light. Generally, the RIN (relative intensity noise) of the pump is transferred to the VCSEL light. Pump lasers can be noisy because of (1) fundamental RIN [15], (2) mode hopping in Fabry-Perot lasers, or (3) because of feedback of pump light reflected back from the VCSEL destabilizing the pump.

SUMMARY OF THE INVENTION

There are several ways of attacking these pump noise problems. Pump feedback can be reduced through (1) Faraday isolation and (2) geometric isolation. Single frequency pump lasers (Distributed feedback lasers (DFB), distributed Bragg reflector lasers (DBR), discrete mode lasers [16,17], volume Bragg grating (VBG) stabilized lasers [18,19,20] can eliminate wavelength jitter and amplitude noise that accompanies mode hopping.

Eliminating wavelength changes or uncertainty in the pump light is also important for other reasons. Optics with wavelength dependent transmission in the path to the VCSEL can convert optical frequency shifts into pump power changes (FM-to-AM conversion). This can happen with noise, also. Wavelength jitter can be converted to effective pump power noise.

Shaping and controlling noise, such as through laser pumps brought into coherence collapse [21,22] are potentially useful. Instead of narrowing the emission pump bandwidth to a single cavity mode, another method of obtaining low noise is to use a super-luminescent light emitting diode (SLED) which is a broad band emitter. Since RIN≈1/Δν [23], the RIN goes down in proportion to the emission bandwidth [23].

In terms of pump noise, 1060 nanometer VCSELs present a special problem. This is because they are typically pumped in the 750-850 nm wavelength range where Faraday isolators are large, heavy, and expensive.

As an alternative to isolation based on Faraday rotators, geometric isolation ideas presented here can at least reduce and possibly prevent optical feedback from the VCSEL to the pump laser. These solutions are particularly useful in miniature bulk optical packages where the VCSEL, and possibly a SOA (semiconductor optical amplifier) and/or pump are integrated into one hermetic package (co-packaged). This is also applicable where just the VCSEL and a WDM (wavelength division multiplexor) filter formed by a dichroic mirror are co-packaged.

Moreover, while the following description concerns noise control in 1060 nanometer VCSELs, this approach can be applied to other VCSEL wavelengths as well.

In general, according to one aspect, the invention features an optically pumped tunable VCSEL swept source module, comprising a VCSEL and a pump for producing light to pump the VSCEL, wherein the pump is geometrically isolated from the VCSEL.

In different embodiments, the pump is geometrically isolated by defocusing light from the pump in front of the VCSEL, behind the VCSEL, and/or by coupling the light from the pump at an angle with respect to the VCSEL. In the last case, angle is usually less than 80 degrees.

The pump can be a VBG or FBG stabilized laser, a discrete mode laser, a DFB laser, and/or DBR laser.

The pump could also be a super luminescent diode (SLED).

The module can further comprise an integrated dichroic filter.

It can also include an SOA and/or possibly an integrate pump chip. An isolator is also useful to isolate the VCSEL from back reflections from the SOA.

In general, according to another aspect, the invention features a method for optically pumping a VCSEL. This method comprises producing pump light with a pump source, coupling the pump light into the VCSEL from the pump source, and preventing the pump light from being coupled back into the pump source by geometric isolation.

In some embodiments, the pump source is geometrically isolated by defocusing, by focusing pump light in front of the VCSEL or by focusing pump light behind the VCSEL The pump source can also be geometrically isolated by coupling the pump light at an angle with respect to the VCSEL. Typically this angle is less than 88 degrees.

The pump source can be a VBG or FBG stabilized laser, a discrete mode laser, a DFB laser, FP laser and/or DBR laser.

The pump source can also be a super luminescent diode (SLED).

The pump source can also be operated in coherence collapse.

In some modules, the pump light from the pump source is coupled to the VCSEL and a swept optical signal generated by the VCSEL separated using a dichroic filter.

Amplifying the swept optical signal with an SOA is also a possibility.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In general, geometric isolation takes advantage of the alignment and/or defocusing of the coupling optics between the pump and the VCSEL to suppress the level of reflections that can couple back into the pump chip. In the case of defocusing, it is helpful to note that the pump spot size on the VCSEL and the mode size of the VCSEL cavity itself do not necessarily need to be the same. This allows the pump light to be slightly defocused on the VCSEL and consequently the fed back light is not perfectly back-focused on the pump. This reduces the effective amount of fed back light.

Figure 1A:
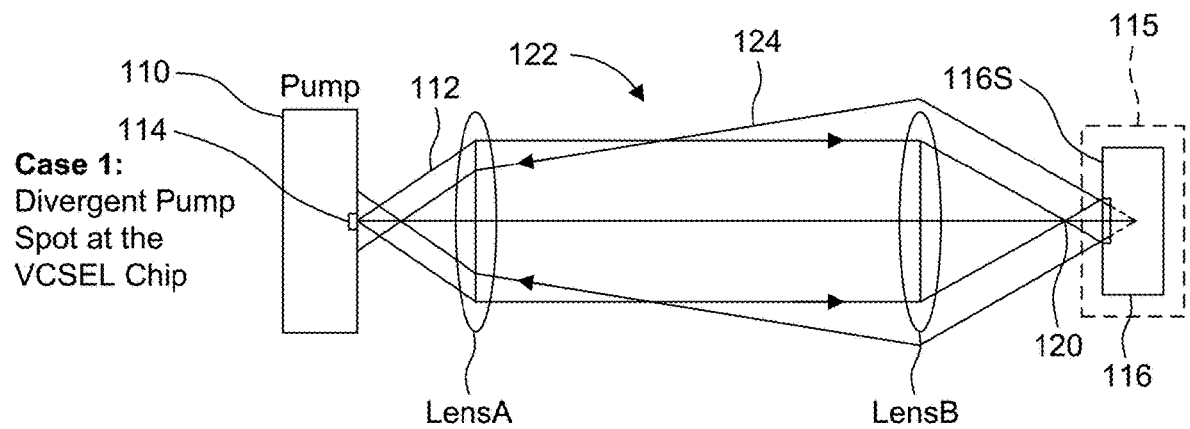
FIGS. 1A and 1B are schematic views showing two approaches, by defocusing, for creating geometric isolation between the pump and the VCSEL in a tunable VCSEL swept source.
Figure 1B:
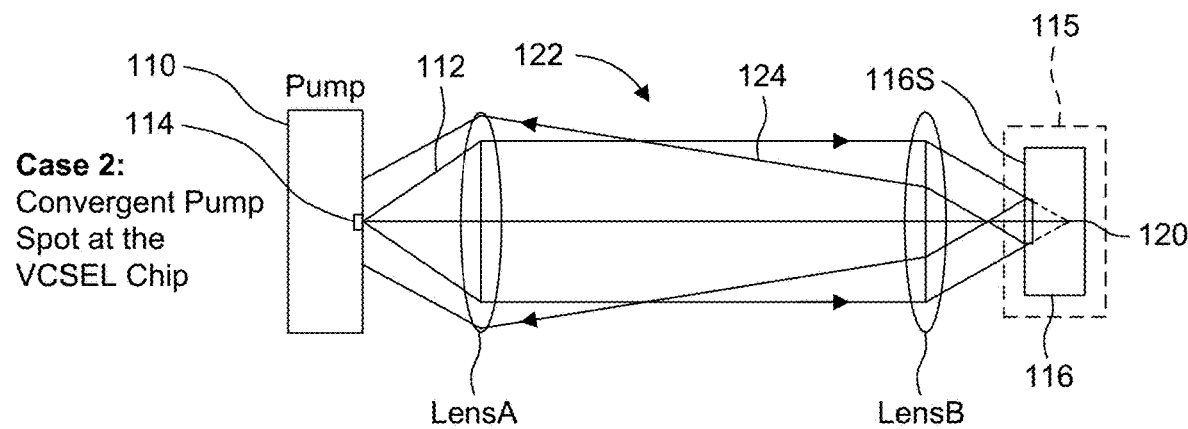

FIGS. 1A and 1B show two examples of geometric isolation by pump defocusing. The pump laser 110 is effectively a point source 114. The pump light aperture 114 might be the pump chip exit facet or the optical fiber that transmits the light from the pump chip to the lens train 122 of the coupling optics. In either case, this pump light is defocused at the gain substrate 116 of the VCSEL 115 by the coupling lens train 122 of two lenses LensA and LensB.

In more detail, as shown in FIG. 1A, light 112 from the pump 110 diverges as it propagates away from the pump light aperture 114.

The pump light aperture 114 in one context is the exit facet of a pump chip. One example chip is a single spatial mode, edge-emitting, ridge waveguide GaAlAs or InGaAs chip.

In another context, the pump light aperture 114 is the exit facet of an optical fiber, such as a single mode optical fiber, that carries light from the pump chip to the lens train 122.

In both of these contexts, pump light aperture 114 approaches a point source, only having an extent of less than a few micrometers in diameter in many cases.

The diverging pump light 112 from the pump source 110 is relayed to the gain substrate 116 of the VCSEL 115 by the coupling lens train 122. Specifically, the pump light is collimated by first lens (LensA) and then focused toward the surface 116S of the gain substrate 116 of the VCSEL 115 by a second lens (LensB).

The characteristics of the coupling lens train 122 such as the power of the first lens and the second lens at the wavelength of light of the pump source 110 along with the distances between the pump light aperture 114, the first lens, the second lens, and the exit facet 118 are selected so that the focal point 120 of the pump light 112 is in front of the proximal surface 116-S of the gain substrate 116 of the VCSEL 115.

Arranging the coupling lens train 122 to focus the pump light 112 in front of the proximal surface of the gain substrate 116 of the VCSEL 115 causes the reflected pump light 124 or pump light exiting the VCSEL 115 to be defocused at the pump source 110.

FIG. 1B shows another arrangement of the coupling lens train 122. In this embodiment, the focal point 120 of the pump light 112 is behind the surface 116S of the gain substrate 116 of the VCSEL 115.

In more detail, light 112 from the pump light source 110 diverges as it propagates away from the pump light aperture 114.

The diverging pump light 112 from the pump source 110 relayed to the gain substrate 116 of the VCSEL 115 by the coupling lens train 122.

The characteristics of the coupling lens train 122 in this example such as the power of the first lens and the second lens at the wavelength of light of the pump source 110 along with the distances between the pump light aperture 114, the first lens, the second lens, and the exit facet 118 are selected so that the focal point 120 of the pump light 112 is behind the proximal surface 116S of the gain substrate 116 of the VCSEL 115.

Arranging the coupling lens train 122 to focus the pump light 112 behind the proximal surface 116S of the gain substrate 116 of the VCSEL 115 causes the returning pump light 124 from the VCSEL 115 to also be defocused at the pump source 110.

In either example, because of pump light defocusing at the VCSEL gain substrate 116, the fed back beam does not focus to a point back at the pump source 110. This reduction in power density reduces the total power of light destabilizing the pump.

This type of geometric isolation can be applied to more complicated beam paths that include mirrors, WDM couplers, and other optical elements. The essential part is the defocusing.

Figure 2:
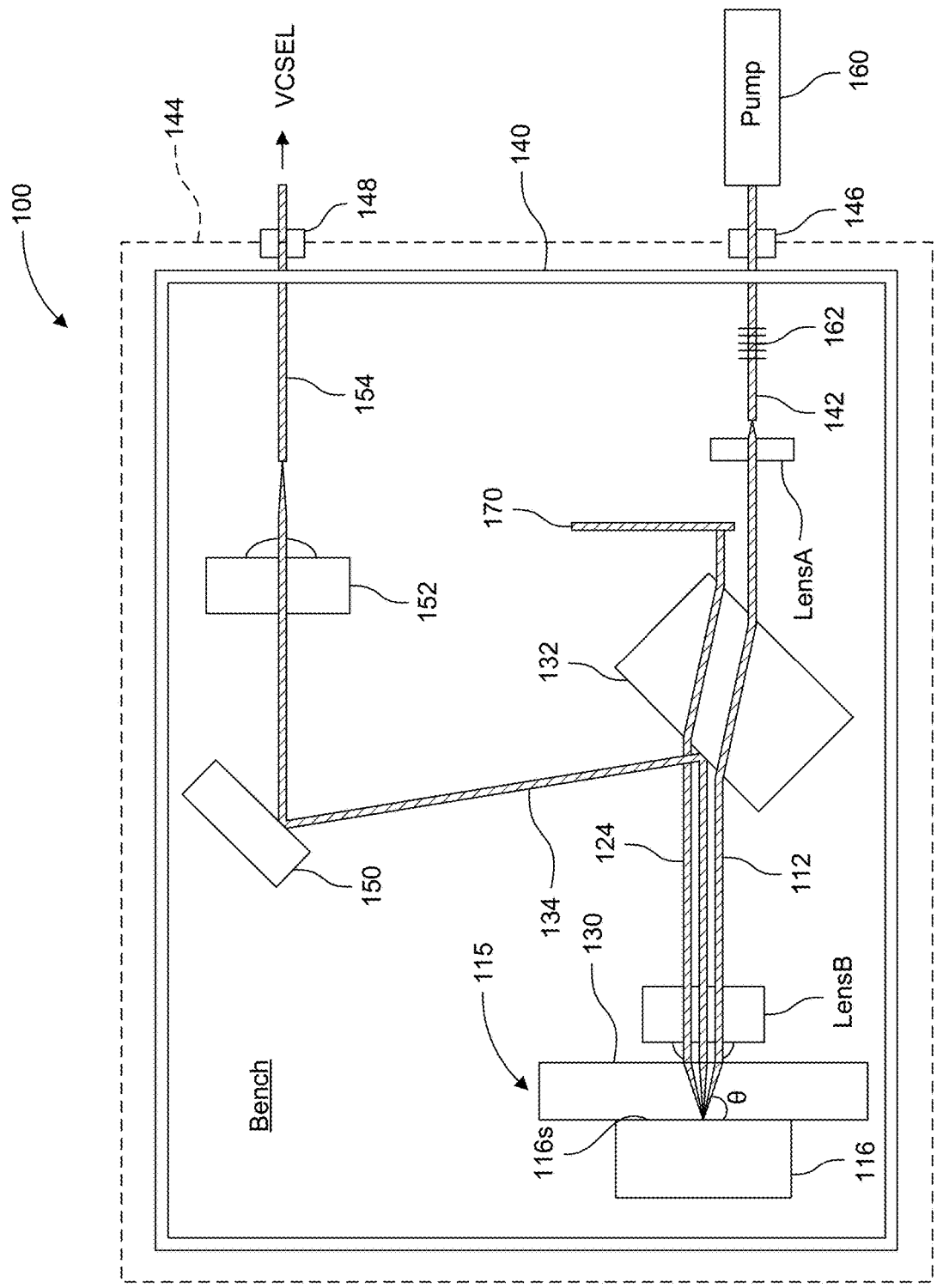
FIG. 2 is a top plan view of an optically pumped tunable VCSEL swept source module and also showing a third approach to geometric isolation whereby the returning pump beam is offset and then possibly blocked.

FIG. 2 shows how the coupling lens train 122, including Lens A and Lens B are integrated into an optically pumped tunable VCSEL swept source module 100.

In one example, the VCSEL 115 is fabricated by bonding a microelectro-mechanical system (MEMS) tunable mirror die 130 to the optical gain/bottom mirror gain substrate 116. In the preferred embodiment, the VCSEL is as described in United States Patent Application US2014/0176958A1, by Flanders, Kuznetsov, Atia, and Johnson, "OCT System with Bonded MEMS Tunable Mirror VCSEL Swept Source", which is incorporated herein in its entirety by this reference.

That said VCSELs with integrated MEMS tunable mirrors are another option. An early example of such an integrated VCSEL is described in U.S. Pat. No. 6,645,784 by Tayebati, et al.

Nevertheless, almost any configuration of optically pumped VCSEL could be used.

A dichroic mirror (filter) allows separation of the VCSEL beam 134 emitted by the VCSEL 115 from the pump light 112, 124.

In the illustrated embodiment, light from a pump chip 160 is coupled to a bench 140 via a pump optical fiber 142. The pump light 112 from the optical fiber 142 is collimated by a first lens LensA that is affixed to the bench 140. The pump light 112 then is transmitted through the dichroic mirror 132 and then focused by a second lens LensB onto the gain substrate 116 of the VCSEL 115.

Preferably, the bench 140, in turn, is installed in a hermetic package 144 with optical fibers passing through fiber-feedthroughs 146, 148 of the package 144.

The dichroic mirror is reflective to longer wavelength of the VCSEL light 134, emitted by the VCSEL, but transmissive to the pump light 112, 124 in the illustrated example. Specifically in the illustrated example, the tunable signal from the VCSEL 115 is reflected by the dichroic mirror 132, which is affixed to the bench 140, and directed to a fold mirror 150 which is also affixed to the bench 140 and then to a third lens 152, which is affixed to the bench 140. The third lens 152 focuses light into an entrance aperture of an output optical fiber 154.

Even with very effective pump isolation, Faraday or geometric, pumps can be noisy on their own. Amplitude noise, frequency noise, or joint amplitude/frequency noise can be a problem. Diode lasers, the most practical pump source, have natural amplitude and frequency noise driven by spontaneous emission and shaped by relaxation oscillations [15]. Fabry-Perot diode lasers can have mode hopping noise. Single frequency pumps, such as DFB (distributed feedback lasers), DBR (distributed Bragg reflection lasers), and discrete mode lasers [16,17], can avoid this issue. Volume Bragg grating stabilized lasers are another candidate [18,19,20].

Figure 3:
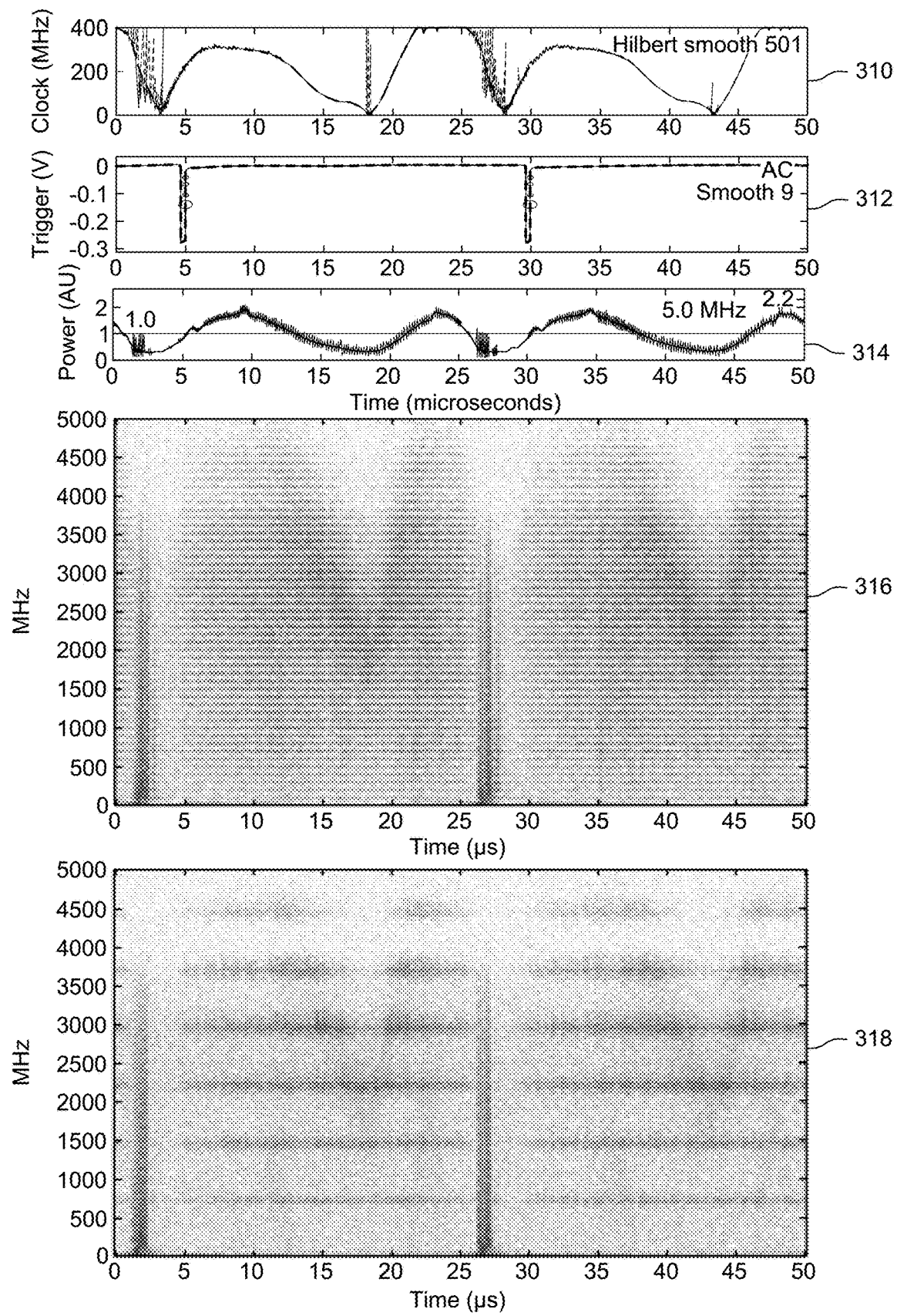
FIG. 3 is a plot of various performance metrics against a common time scale in microseconds over the course of wavelength sweeps of the VCSEL, in which the clock plot 310 shows the k-clock sampling frequency over the course of both VCSEL sweeps, the trigger plot 312 shows the trigger voltage for each of the two sweeps, the power plot 314 shows the power output from the VCSEL, the first spectrogram plot 316 is a spectrogram of the optical power output from the 808 nanometer pump laser operating in the coherence collapse regime with feedback from a fiber Bragg grating placed one meter away from the chip in the fiber, and the second spectrogram plot 318 is a spectrogram of the optical power output of the 808 nanometer pump laser operating in the coherence collapse regime with a fiber Bragg grating placed 0.14 meters away in the fiber.

Placing the pump in the coherence collapse regime of operation allows control of the pump noise, if not eliminating it. Coherence collapse can be induced by placing a reflector some distance from the laser diode chip to destabilize it in a controlled way [21]. Often this is done by placing a fiber Bragg grating (FBG) 162 in the laser pigtail 142 [22]. The FBG 162 limits laser emission to a narrow band of wavelengths and induces coherence collapse which generates randomly phased modes c/(2L) apart, where c is the speed of light and L is the equivalent air distance between the laser chip and the FBG. Beating between these modes creates amplitude noise bands spaced c/(2L) apart in RF frequency. Reducing L, as seen in FIG. 3, can shift and spread out the noise to create wide bands of low noise, and can be sufficient to eliminate this source of noise from the detection bandwidth in many OCT applications. There is still noise in a narrow band around DC, but this may be acceptable in many cases.

FIG. 2 also shows another geometric isolation strategy. The VCSEL 115 receives the pump beam 112 at an angle. The angle between the incident and reflected pump beams must be greater than the divergence angle of the pump beam. Preferably the angle $\theta$ between the center axis of the incoming pump beam 112 and the proximal surface 116S of the gain substrate 116 is less than 88 degrees, and preferably greater than 75 degrees in the horizontal or vertical planes, or some hybrid plane, which angle is generally dictated by the aperture of the focusing lens LensB in front of the VCSEL. This is achieved by aligning Lens B so that the beam of pump light 112 is offset from the center of Lens B and also offset from the axis of the VCSEL light 134 exiting from the VCSEL 115.

With this configuration, the reflected beam 124 of pump light is now displaced from the incoming beam 112. In the illustrated embodiment a light absorbing beam block substrate 170 is installed on the bench 140 to intercept the reflected beam 124. This prevents feedback that will destabilize the pump.

Here, a non-normal incidence angle of the incoming pump beam 112 into the VCSEL 115 offsets the reflected beam 124 in space so that it can be blocked by a natural lens aperture or by the beam block 170 intentionally inserted into the package and installed on the bench 140. In the case of single transverse mode source, fiber or laser, the offset angle of the returning beam can prevent coupling of the returning light, even without a beam block or aperture. These methods prevent light from being feed back into the pump 160 and destabilizing it (making it noisy).

The offset of the reflected beam 124 is controlled by precise control of the incidence angle $\theta$ of the incoming pump beam 112 focused into the VCSEL at the gain substrate 116. Here the pump 160 and any SOA are external to the integrated hermetic package 144 and connected through optical fibers 154, 142. In other schemes, either the pump or SOA or both could be incorporated into the package 144 and still benefit from use of any of the three forms of geometric isolation. These ideas enable low noise VCSEL pumping without the adoption of bulky, high-cost Faraday isolation.

FIG. 3 includes spectrograms showing how VCSEL amplitude noise can be tailored into wide, low noise bands by using a pump purposefully put into a state of coherence collapse. Coherence collapse is induced by placing a fiber Bragg grating (FBG) 162 into the pigtail 142 of the pump laser 160. By shortening the fiber length, defining a secondary cavity between the pump chip 160 and FBG 162, to 0.14 meters, a 700 MHz wide low noise region is created that is wide enough for many OCT applications. Generally, the secondary cavity should be equivalent to about 0.3 meters in fiber or less, or 0.5 meters equivalent air path or less.

The FBG 162 in the pump pigtail 142 provides improved operation even when imperfect geometric isolation is present. In this case, the FBG pump in coherence collapse improved stability. It does two things: It changes a popcorn-like noise process to a more smooth Gaussian-like process. Then the short fiber length moves the noise bands out to n×700 Hz. Unfortunately there is still noise near DC, but it is easier to deal with.

Figure 4A:
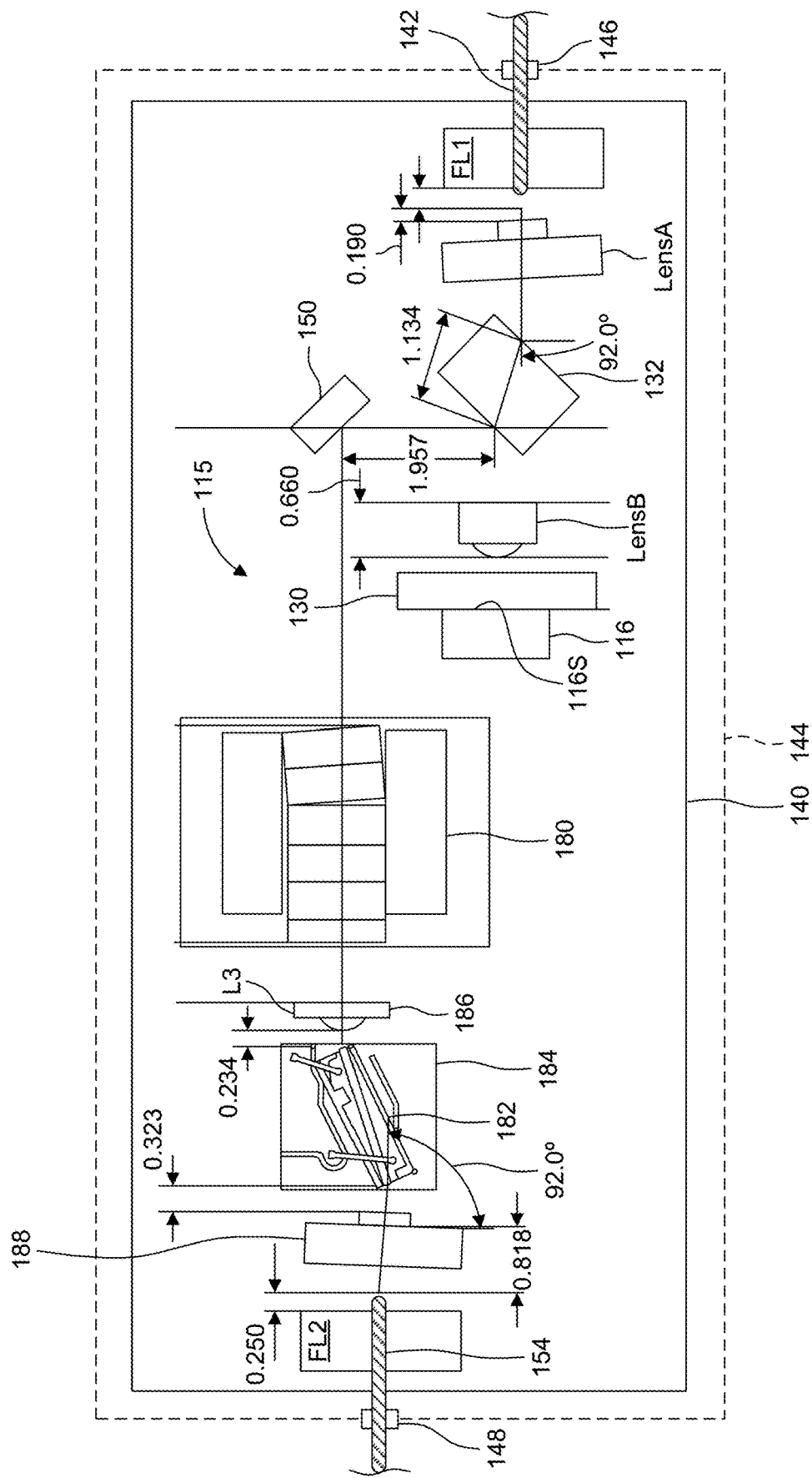
FIGS. 4A and 4B are plan views of three different optically-pumped tunable VCSEL swept source modules.
Figure 4B:
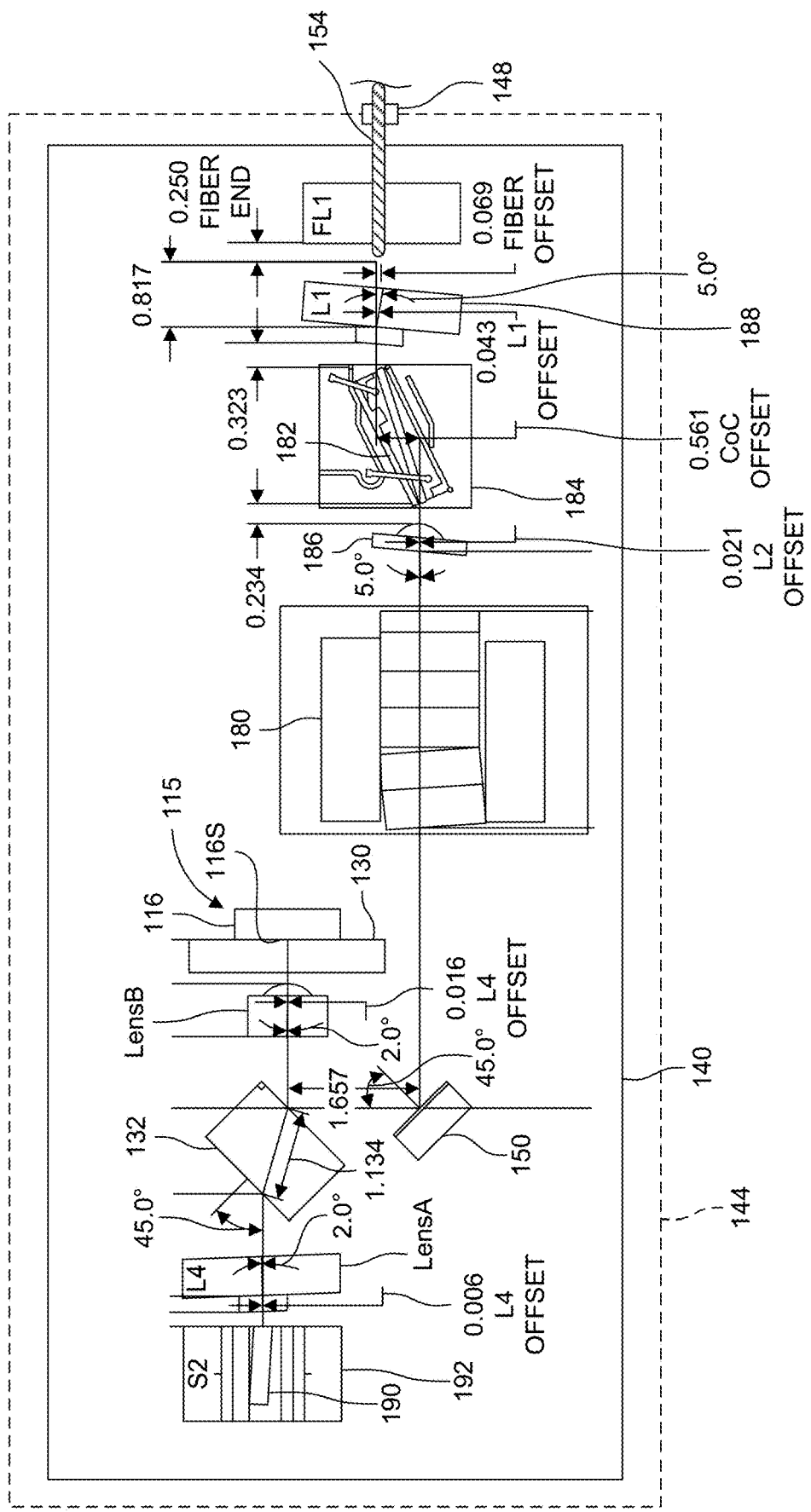

FIGS. 4A and 4B show two additional optical layouts or optically-pumped tunable VCSEL swept source modules with various levels of co-package integration.

FIG. 4A shows an optically-pumped tunable VCSEL swept source module with an amplification stage.

In more detail, the pump light is received into the hermetic package 144 and onto the bench 140 from a separately packaged pump laser 160. The pump's pigtail 142 is received through a feedthrough 146 in the package 144 and its end is secured down onto the bench 140 by a fiber mounting structure FL1. The fiber mounting structure FL1 is preferably a fiber LIGA fiber holder (LIGA=Lithographie, Galvanoformung, Abformung (in English: Lithography, Electroplating, and Molding)).

Coherence collapse pumping is possible in this version by adding a fiber Bragg grating to the pigtail 142.

The pump light is transmitted through the angled WDM filter/dichroic mirror 132 and transmitted through the tunable mirror of the MEMS tunable mirror die 130. The light is focused onto the proximal surface 116S of the gain substrate 116 by the Lens B.

In terms of coupling the pump light into the gain substrate 116 any of the three previous techniques can be employed. The pump light can be defocused in front of the proximal surface 116S as shown in FIG. 1A; the pump light can be defocused behind the proximal surface 116S as shown in FIG. 1B; or the pump light coupled into the gain substrate at an angle, displaced from the center axis of Lens B as described in connection with FIG. 2.

The dichroic mirror 132 reflects the VCSEL light 134, emitted by the VCSEL. The tunable signal from the VCSEL 115 is reflected by the dichroic mirror 132, which is affixed to the bench 140, and directed to the fold mirror 150 which is also affixed to the bench 140.

The VCSEL light is then directed to pass through an isolator 180 that prevents backreflections. After the isolator, a focusing lens 186 couples the VCSEL light into an SOA 182 mounted to a submount 184, which in turn is mounted to the bench 140. At the output side of the SOA 182, the amplified VCSEL light is focused by an output focusing lens 188 to couple the light into an output fiber pigtail 154 secured to the bench by a second fiber mounting structure FL2.

FIG. 4B shows another optically-pumped tunable VCSEL swept source module with an amplification stage. It is similar in construction and operation to the embodiment shown in FIG. 4A, so that explanation applies here.

The difference is that the pump 160 is integrated onto the bench 140 and in the package 144. Specifically, a pump chip 190 is mounted to a pump submount 192, which in turn is mounted to the bench.

It should be noted that even with very effective pump isolation, Faraday or geometric, pumps can be noisy on their own. Amplitude noise, frequency noise, or joint amplitude/frequency noise can be a problem. Diode lasers as describe above, the most practical pump source, have natural amplitude and frequency noise driven by spontaneous emission and shaped by relaxation oscillations [15]. Fabry-Perot diode lasers can have mode hopping noise. Single frequency pumps, such as DFB (distributed feedback lasers), DBR (distributed Bragg reflection lasers), and discrete mode lasers [16,17], can avoid this issue. Volume Bragg grating stabilized lasers are another candidate [18,19,20].

Thus, in one implementation, a volume Bragg grating (VBG) 194 added between the pump chip 190 and the dichroic mirror 132. Specifically, the VBG could be added before lens L4 in the diverging beam, or after lens L4 in the collimated beam, as shown.

Alternatively, the VBG, appropriately angled, could also be added as an integral part of the WDM dichroic mirror 132. This last configuration would require fabricating the VBG inside the WDM substrate with an appropriate angle for the non-normal angle of incidence. The VBG could also be fabricated as integral part of the first coupling lens LensA (for example GRIN lens, glass asphere lens) in the optical train 122, as a means to reduce the optical cavity lengths (allows for wider spacing of the longitudinal modes which is more favorable for wavelength stabilization) and to reduce the overall size of the assembly.

There are many packaging configurations that could make use of these ideas for low-noise optical pumping of a tunable VCSEL. The key ideas are (1) geometric pump isolation, (2) single-frequency pumping (with DFB, DBR, discrete mode, or VBG-stabilized lasers), (3) broad band pumping with a SLED, (4) pumping with an FBG stabilized laser in coherence collapse, and (5) pumping with a standard pigtailed laser (without FBG) in coherence collapse due to a small feedback from the VCSEL.

Figure 5:
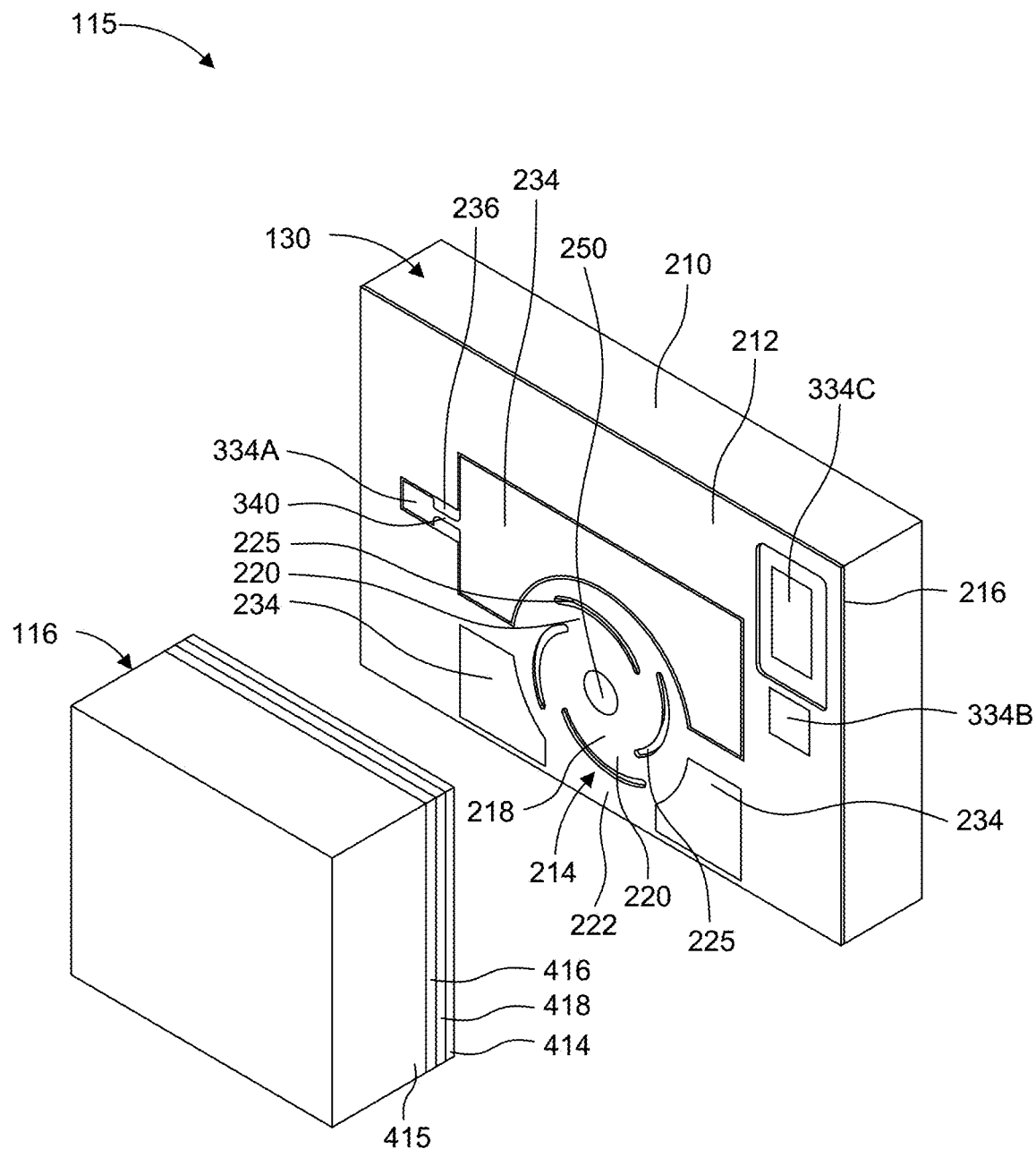
FIG. 5 is an exploded perspective view of a MEMS tunable VCSEL showing one example of the VCSEL 115 and its gain substrate 116.

FIG. 5 shows one exemplary MEMS tunable VCSEL 115 for inclusion in the optically pumped tunable VCSEL swept source module 100 described above.

The MEMS tunable VCSEL 115 comprises the MEMS tunable mirror die or device 130 that is bonded to the optical gain/bottom mirror gain substrate 116, also known as a half VCSEL.

In more detail, the MEMS tunable mirror 130 comprises handle wafer material 210 that functions as a support. Currently, the handle is made from doped silicon.

An optical membrane or device layer 212 is added to the handle wafer material 210. Typically silicon on isolator (SOI) wafers are used. The membrane structure 214 is formed in this optical membrane layer 212. In the current implementation, the membrane layer 212 is silicon that is low doped with resistivity>1 ohm-cm, carrier concentration<5×1015 cm-3, to minimize free carrier absorption of the transmitted light. For electrical contact, the membrane layer surface is usually additionally doped with ion implantation.

During manufacture, the insulating layer 216 functions as a sacrificial/release layer, which is partially removed to release the membrane structure 214 from the handle wafer material 210. Then during operation, the remaining portions of the insulating layer 216 provide electrical isolation between the patterned device layer 212 and the handle material 210.

In the current embodiment, the membrane structure 214 comprises a body portion 218. The optical axis of the device 115 passes concentrically through this body portion 218 and orthogonal to a plane defined by the membrane layer 212. A diameter of this body portion 218 is preferably 300 to 600 micrometers; currently it is about 500 micrometers.

Tethers 220 (four tethers in the illustrated example) are defined by arcuate slots 225 fabricated into the device layer 212. The tethers 220 extend radially from the body portion 218 to an outer portion 222, which comprises the ring where the tethers 220 terminate. In the current embodiment, a spiral tether pattern is used.

A membrane mirror dot 250 is disposed on body portion 218 of the membrane structure 214. In some embodiments, the membrane mirror 250 is optically curved to form an optically concave optical element to thereby form a curved mirror laser cavity. In other cases, the membrane mirror 250 is a flat mirror, or even possibly convex.

When a curved membrane mirror 250 is desired, this curvature can be created by forming a depression in the body portion 218 and then depositing the material layer or layers that form mirror 250 over that depression. In other examples, the membrane mirror 250 can be deposited with a high amount of compressive material stress that will result in its curvature.

The membrane mirror dot 250 is preferably a reflecting dielectric mirror stack. In some examples, it is a dichroic mirror-filter that provides a defined reflectivity, such as between 1 and 10%, to the wavelengths of laser light generated in the VCSEL 115, whereas the optical dot 250 is transmissive to wavelengths of the pump light 112 that are used to optically pump the active region in the half VCSEL device 116.

In the illustrated embodiment, three metal pads 234 are deposited on the proximal side of the membrane device 110. These are used to solder or thermocompression bond, for example, the half VCSEL device 116 onto the proximal face of the membrane device 130. The top pad also provides an electrical connection to the half VCSEL device 116.

Also provided are three wire bondpads 334A, 334B, and 334C. The left VCSEL electrode wire bond pad 334A is used to provide an electrical connection to the metal pads 234. On the other hand, the right membrane wire bond pad 234B is used to provide an electrical connection to the membrane layer 212 and thus the membrane structure 214. Finally, the handle wire bond pad 334C is used to provide an electrical connection to the handle wafer material 210.

The half VCSEL device 116 generally comprises an antireflective coating 414, which is optional, and an active region 418, which preferably has a single or multiple quantum well structure. The cap layer can be used between the antireflective coating 414, if present, and the active region 418. The cap layer protects the active region from the surface/interface effects at the interface to the AR coating and/or air. The back mirror 416 of the laser cavity is defined by a distributed Bragg reflector (DBR) mirror. Finally, a VCSEL spacer 415, such as GaAS, functions as a substrate and mechanical support.

The material system of the active region 418 of the VCSEL device 116 is selected based on the desired spectral operating range. Common material systems are based on semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths.

In the preferred embodiment, the polarization of the light generated by the MEMS tunable VCSEL 115 is preferably controlled and at least stabilized. In general, this class of devices has a cylindrical resonator that emits linearly polarized light. Typically, the light is polarized along the crystal directions with one of those directions typically being stronger than the other. At the same time, the direction of polarization can change with laser current or pumping levels, and the behaviors often exhibit hysteresis.

Different approaches can be taken to control the polarization. In one embodiment, polarization selective mirrors are used. In another example, non-cylindrical resonators are used. In still a further embodiment, asymmetrical current injection is used when electrical pumping is employed. In still other examples, the active region substrate includes trenches or materials layers, which result in an asymmetric stress, strain, heat flux or optical energy distribution, are used in order to stabilize the polarization along a specified stable polarization axis. In still a further example, asymmetric mechanical stress is applied to the VCSEL device 116.

Defining the other end of the laser cavity is the rear mirror 416 that is formed in the half VCSEL device 116. In one example, this is a layer adjacent to the active region 418 that creates the refractive index discontinuity that provides for a portion of the light to be reflected back into the cavity, such as between one and 10%. In other examples, the rear mirror 116 is a high reflecting layer that reflects over 90% of the light back into the laser cavity.

In still other examples, the rear VCSEL distributed Bragg reflector (DBR) mirror 416 is a dichroic mirror-filter that provides a defined reflectivity, such as between 1 and 100%, to the wavelengths of laser light generated in the laser 115, whereas the rear mirror 116 is transmissive to wavelengths of light that are used to optically pump the active region in the VCSEL device 116, thus allowing the VCSEL device 112 to function as an input port of pump light.

Figure 6:
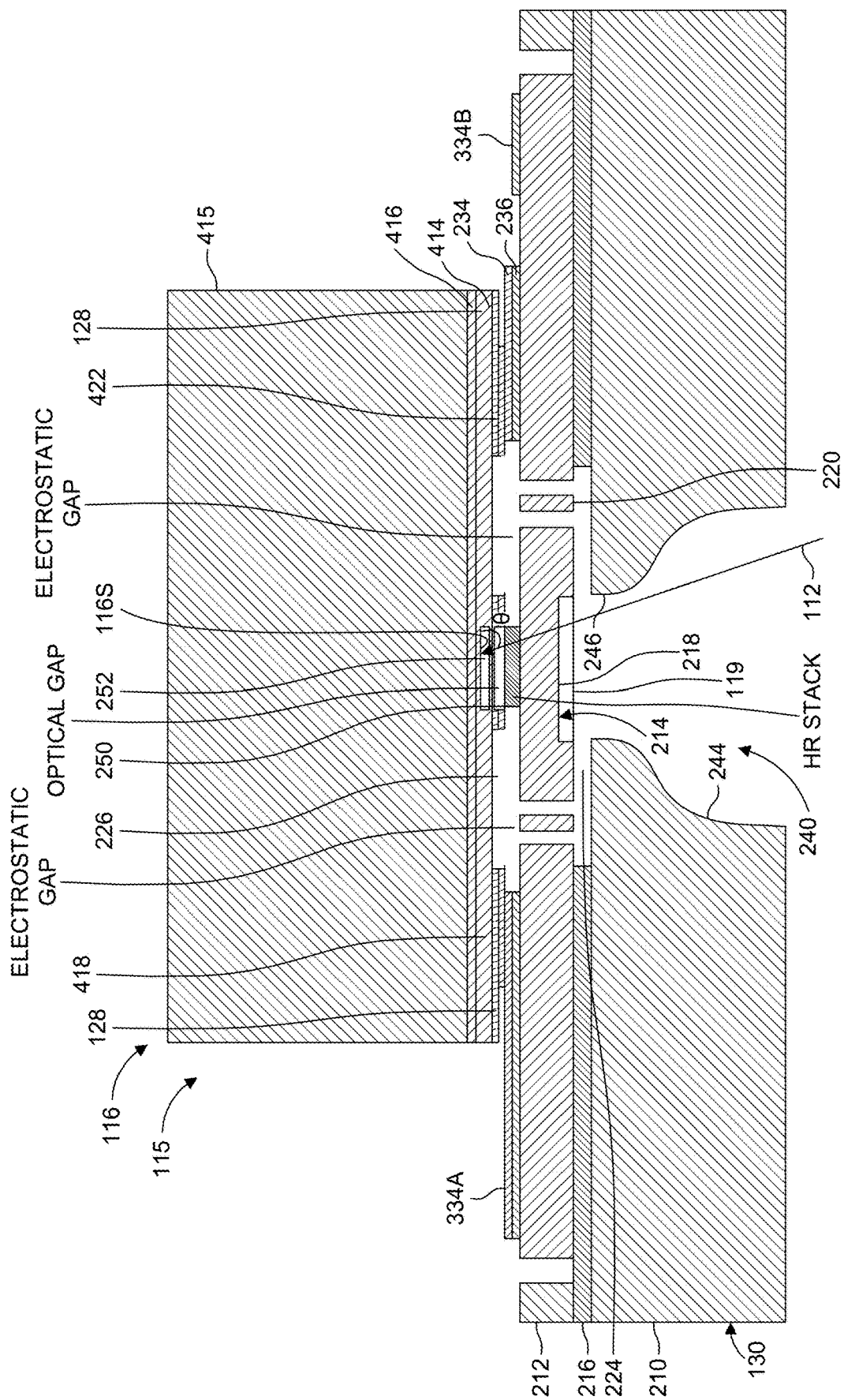
FIG. 6 is a cross-section of the VCSEL of FIG. 5.

FIG. 6 schematically shows the MEMS tunable VCSEL 100 in cross-section along A-A to show a proximal-side electrostatic cavity and a distal-side electrostatic cavity 224.

An optical port 240 through handle wafer material 210 has generally inward sloping sidewalls 244 that end in the port opening 246. As a result, looking through the distal side of the handle wafer 210, the body portion 218 of the membrane structure 214 is observed. The port is preferably concentric with the membrane mirror dot 250. Further, the backside of the body portion 218 is coated with a membrane backside AR coating 119 in some examples. This AR coating 119 is used to facilitate the coupling of pump light 112 into the laser cavity and/or the coupling of laser light 134 out of the cavity.

The thickness of insulating layer 216 defines the electrostatic cavity length of the distal-side electrostatic cavity 224. Presently, the insulating layer 216 is between 3.0 and 6.0 µm thick. It is a general rule of thumb, that electrostatic elements can be tuned over no greater than one third the distance of the electrostatic cavity. As result, the body portion 218, and thus the mirror optical coating 230 can be deflected between 1 and 3 µm in the distal direction (i.e., away from the VCSEL device 112), in one embodiment.

Also shown are details concerning how the half VCSEL device 116 is bonded to the membrane device 130. The MEMS device bond pads 234 bond to VCSEL proximal-side electrostatic cavity electrode metal 422. These metal layers are electrically isolated. Specifically, the MEMS device bond pads 234 are separated from the membrane layer 212 by MEMS device bond pad isolation oxide 236; the VCSEL proximal-side electrostatic cavity electrode metal 422 is isolated from the remainder of the VCSEL device by the VCSEL isolation oxide layer 128. Neither of the VCSEL proximal-side electrostatic cavity electrode metal 422 nor the VCSEL isolation oxide layer 128 interfere with the optical operation since they do not extend into the region of the free-space portion 252 of the laser's optical cavity.

The distal-side electrostatic cavity 224 and the proximal-side electrostatic cavity 226 are located on either side of the membrane structure 214. Specifically, the distal-side electrostatic cavity 224 is created between the handle wafer material 210 and the membrane structure 214, which is the suspended portion of the membrane layer 212. A voltage potential between the handle wafer material 210 and the membrane layer 212 will generate an electrostatic attraction between the layers and pull the membrane structure 214 toward the handle wafer material 210. On the other hand, the proximal-side electrostatic cavity 226 is created between the membrane structure 214 and the VCSEL proximal-side electrostatic cavity electrode metal 422. A voltage potential between the membrane layer 212 and the VCSEL proximal-side electrostatic cavity electrode metal 422 will generate an electrostatic attraction between the layers and pull the membrane structure 214 toward the VCSEL device 112.

In general, the size of the proximal-side electrostatic cavity 226 measured along the device's optical axis is defined by the bond metal thickness, thickness of VCSEL proximal-side electrostatic cavity electrode metal 422 and MEMS device bond pads 234 along with the thicknesses VCSEL isolation oxide layer 128 and MEMS device bond pad isolation oxide 236.

The minimum oxide thickness is determined by the required voltage isolation. Oxide break down is nominally 1000V/micrometer. So, for 200V isolation that would be 2000 A, which is preferably doubled for margin. So the thickness of layers VCSEL isolation oxide layer 128 and MEMS device bond pad isolation oxide 236 is greater than 4000 A.

The current metal bond thickness is 6000 A (each layer) with approx. 3000 A compression during bonding. Based on this, the minimum size of the proximal-side electrostatic cavity 226 is 0.85 micrometers.

At this minimum electrostatic gap point, a zero optical gap results when the membrane mirror dot 250 is 1.7 micrometers thick.

To increase the optical gap, the thickness of the VCSEL isolation oxide layer 128 can be increased without effecting the operation of the cavity.

It should be noted that in the defocus methods of pump isolation discussed with respect to FIGS. 1A and 1B, the defocusing is with respect to the surface 116S of the gain substrate or half VCSEL 116. The location of this internal surface is best shown in FIG. 6.

In a similar vein, pump beam 112 angle θ is measured with respect to the surface 116S, shown in FIG. 6.

REFERENCES

[1] B. Potsaid, V. Jayaraman, J. G. Fujimoto, J. Jiang, P. J. S. Heim, A. E. Cable, "MEMS tunable VCSEL light source for ultrahigh speed 60 kHz-1 MHz axial scan rate and long range centimeter class OCT imaging", Proc. of SPIE, 8213, 82130M-1/8, (2012)

[2] D. D. John, C. B. Burgner, B. Potsaid, M. E. Robertson, B. K. Lee, W. J. Choi, A. E. Cable, J. G. Fujimoto, and V. Jayaraman, "Wideband electrically-pumped 1050 nm MEMS-tunable VCSEL for ophthalmic imaging," J. Lightwave Technol. 33, 3461-3468 (2015)

[3] Z. Wang, B. Potsaid, L. Chen, C. Doerr, H-C. Lee, T. Nielson, V. Jayaraman, A. E Cable, E. Swanson, and J. G. Fujimoto, "Cubic meter volume optical coherence tomography", Optica, 3, 1496-1503 (2016)

[4] B. Johnson, W. Atia, M. Kuznetsov, B. D. Goldberg, P. Whitney, and D. C. Flanders, "Coherence properties of short cavity swept lasers," Biomed. Opt. Express 8, 1045-1055 (2017)

[5] Y. Matsui, D. Vakhshoori, P. Wang, P. Chen, C-C. Lu, M. Jiang, K. Knopp, S. Burroughs, and P. Tayebati, "Complete Polarization Mode Control of Long-Wavelength Tunable Vertical-Cavity Surface-Emitting Lasers Over 65-nm Tuning, Up to 14-mW Output Power", IEEE J. Quantum Electronics, 39, 1037-1048 (2003)

[6] Y. Rao, W. Yang, C. Chase, M. C. Y. Huang, D. P. Worland, S. Khaleghi, M. R. Chitgarha, M. Ziyadi, A. E. Willner, and C. J. Chang-Hasnain, "Long-Wavelength VCSEL Using High-Contrast Grating", IEEE J. Selected Topics in Quantum Electronics, 19, 1701311-1701311 (2013)

[7] Bandwidth10, Inc. tunable VCSELs. http://www.bandwidth10.com/

[8] D. D. John, B. Lee, B. Potsaid, A. C. Kennedy, M. E. Robertson, C. B. Burgner, A. E. Cable, J. G. Fujimoto, and V. Jayaraman, "Single-Mode and High-Speed 850 nm MEMS-VCSEL," in Lasers Congress 2016, OSA Technical Digest (Optical Society of America, 2016), paper ATh5A.2

[9] V. Jayaraman, J. Jiang, B. Potsaid, M. Robertson, P. J. S. Heim, C. Burgner, D. John, G. D. Cole, I. Grulkowski, J. G. Fujimoto, A. M. Davis, and A. E. Cable, "VCSEL Swept Light Sources", 659-686, in Optical Coherence Tomography, W. Drexler, J. G. Fujimoto (eds.), Springer International Publishing Switzerland 2015

[10] V. Jayaraman, D. D. John, C. Burgner, M. E. Robertson, B. Potsaid, J. Y. Jiang, T. H. Tsai, W. Choi, C. D. Lu, P. J. S. Heim, J. G. Fujimoto, and A. E. Cable, "Recent Advances in MEMS-VCSELs for High Performance Structural and Functional SS-OCT Imaging", Proc. of SPIE 8934, 893402-1/11 (2014)

[11] Thorlabs 1310 nm MEMS-VCSEL swept laser: https://www.thorlabs.com/newgrouppage9.cfm?objectgroup_id=7109

[12] V. Jayaraman, G. D. Cole, M. Robertson, A. Uddin and A. Cable, "High-sweep-rate 1310 nm MEMS-VCSEL with 150 nm continuous tuning range," Electronics Letters, 48, 867-869 (2012)

[13] V. Jayaraman, G. D. Cole, M. Robertson, C. Burgner, D. John, A. Uddin and A. Cable, "Rapidly swept, ultra-widely-tunable 1060 nm MEMS-VCSELs", Electronics Letters, 48, 1331-1333 (2012)

[14] I. Grulkowski, J. J. Liu, B. Potsaid, V. Jayaraman, C. D. Lu, J. Jiang, A. E. Cable, J. S. Duker, and J. G. Fujimoto, "Retinal, anterior segment and full eye imaging using ultra-high speed swept source OCT with vertical-cavity surface emitting lasers," Biomed. Opt. Express 3, 2733-2751 (2012)

[15] L. A. Coldren and S. W. Corzine, Diode lasers and photonic integrated circuits, Chapter 5, John Wiley & Sons, Inc. 1995

[16] Eblana Photonics. http://www.eblanaphotonics.com/news-and-events.php

[17] J. O'Carroll, R. Phelan, B. Kelly, D. Byrne, L. P. Barry, and J. O'Gorman, "Wide temperature range 0<T<85° C. narrow linewidth discrete mode laser diodes for coherent communications applications", Optics Express, 19, B90-B95 (2011)

[18] H. Wenzel, K. Häusler, G. Blume, J. Fricke, M. Spreemann, M. Zorn, and G. Erbert, "High-power 808 nm ridge-waveguide diode lasers with very small divergence, wavelength-stabilized by an external volume Bragg grating", Optics Letters, 34, 1627-1629 (2009)

[19] Ondax, Inc. http://www.ondax.com/downloads/sure-lock/Laser-Selector-Guide-2.pdf

[20] Laser Components, Inc. https://www.lasercomponents.com/fileadmin/user_upload/home/Datasheets/pd_ld/luxxmaster_785nm_butterfly.pdf

[21] Q. Zou and S. Azouigui, "Analysis of Coherence-Collapse Regime of Semiconductor Lasers Under External Optical Feedback by Perturbation Method", Chapter 5 in Semiconductor Laser Diode Technology and Applications, Edited by Dnyaneshwar Patil, open access https://www.intechopen.com/books/semiconductor-laser-diode-technology-and-applications

[22] Lumics GmbH. 808 nm pump laser with FBG option: http://www.lumics.de/wp-content/uploads/LU0808M250.pdf

[23] Fiber Optic Test and Measurement, Dennis Derickson, Editor, Prentice Hall, 1998, p. 602, section entitled "Special Case for ASE Sources"

[24] United States Patent Application US20140176958A1, D. C. Flanders, M. E. Kuznetsov, W. A. Atia, B. C. Johnson, "OCT System with Bonded MEMS Tunable Mirror VCSEL Swept Source", Priority date 2012 Dec. 21

While this invention has been particularly shown and described with references to preferred embodiments thereof, it will be understood by those skilled in the art that various changes in form and details may be made therein without departing from the scope of the invention encompassed by the appended claims.

What is claimed is:

1. An optically pumped tunable VCSEL, swept source module, comprising:
   a VCSEL;
   a pump for producing light to pump the VCSEL, wherein the pump is geometrically isolated from the VCSEL by defocusing along an optical axis of the VCSEL; and
   an integrated dichroic filter.

2. The module of claim 1, wherein the pump is geometrically isolated by defocusing, by focusing light from the pump in front of the VCSEL.

3. The module of claim 1, wherein the pump is geometrically isolated by defocusing, by focusing light from the pump behind the VCSEL.

4. The module of claim 1, wherein the pump is a VBG or FBG stabilized laser, a discrete mode laser, a DFB laser, FP laser and/or DBR laser.

5. The module of claim 1, wherein the pump is a super luminescent diode (SLED).

6. The module of claim 1, wherein the pump is operated in coherence collapse.

7. The module of claim 1, further comprising an SOA.

8. The module of claim 1, further comprising a VBG to induce single mode (frequency) behavior.

9. The module of claim 1, further comprising an SOA and an isolator.

10. The module of claim 1, wherein the pump is geometrically isolated by defocusing, with a first lens that collimates the light from the pump and a second lens that focuses the light, from the pump and collimated by the first lens, in front of the VCSEL.

11. The module of claim 1, wherein the pump is geometrically isolated by defocusing, with a first lens that collimates the light from the pump; and a second lenses that focuses the light, from the pump and collimated by the first lens, behind the VCSEL.

12. A method for optically pumping a VCSEL, comprising:
    producing pump light with a pump source;
    coupling the pump light into the VCSEL from the pump source;
    preventing the pump light from being coupled hack into the pump source by geometric isolation by defocusing along an optical axis of the VCSEL; and
    coupling the pump light from the pump source to the VCSEL, and separating out a swept optical signal generated by the VCSEL, using a dichroic filter.

13. The method of claim 12, wherein the pump source is geometrically isolated by defocusing, by focusing pump light in front of the VCSEL.

14. The method of claim 12, wherein the pump source is geometrically isolated by defocusing, by focusing pump light behind the VCSEL.

15. The method of claim 12, wherein the pump source is a VBG or FBG stabilized laser, a discrete mode laser, a DFB laser, FP laser and/or DBR laser.

16. The method of claim 12, wherein the pump source is a super luminescent diode (SLED).

17. The method of claim 12, further comprising amplifying the swept optical signal with an SOA.

18. The method of claim 12, further comprising isolating the SOA from the VCSEL, using an isolator.

19. A method for optically pumping a VCSEL, comprising:
    producing pump light with a pump source;
    coupling the pump light into the VCSEL from the pump source; and
    preventing the pump light from being coupled back into the pump source by, geometric isolation;
    wherein the pump source is operated in coherence collapse.

* * * * *

UNITED STATES PATENT AND TRADEMARK OFFICE
CERTIFICATE OF CORRECTION

PATENT NO. : 10,951,007 B2
APPLICATION NO. : 16/409272
DATED : March 16, 2021
INVENTOR(S) : Bartley C. Johnson et al.

Page 1 of 1

It is certified that error appears in the above-identified patent and that said Letters Patent is hereby corrected as shown below:

In the Claims

In Claim 12, Column 14, Line 33, delete "preventing the pump light from being coupled hack into" and insert --preventing the pump light from being coupled back into--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*